United States Patent
Ganguly et al.

(10) Patent No.: US 9,502,521 B2
(45) Date of Patent: Nov. 22, 2016

(54) MULTI-LAYER CHARGE TRAP SILICON NITRIDE/OXYNITRIDE LAYER ENGINEERING WITH INTERFACE REGION CONTROL

(75) Inventors: Udayan Ganguly, San Jose, CA (US); Christopher S. Olsen, Fremont, CA (US); Sean M. Seutter, San Jose, CA (US); Lucien Date, Ottignies (BE)

(73) Assignee: Applied Materials, Inc., Santa Clara, CA (US)

( * ) Notice: Subject to any disclaimer, the term of this patent is extended or adjusted under 35 U.S.C. 154(b) by 155 days.

(21) Appl. No.: 13/189,225

(22) Filed: Jul. 22, 2011

(65) Prior Publication Data
US 2011/0281429 A1   Nov. 17, 2011

Related U.S. Application Data

(62) Division of application No. 12/610,457, filed on Nov. 2, 2009.

(51) Int. Cl.
*H01L 21/28* (2006.01)
*H01L 29/51* (2006.01)

(52) U.S. Cl.
CPC ....... *H01L 29/513* (2013.01); *H01L 21/28282* (2013.01); *H01L 29/518* (2013.01)

(58) Field of Classification Search
CPC ............... H01L 29/513; H01L 29/518; H01L 21/28282
USPC ........ 438/211, 261, 264, 288, 785; 257/321, 257/322, 324–326, E29.309, E29.306, 257/E21.21, E21.423, E21.679
See application file for complete search history.

(56) References Cited

U.S. PATENT DOCUMENTS

| | | | |
|---|---|---|---|
| 6,584,015 B2 | 6/2003 | Katayama et al. | |
| 7,012,299 B2 | 3/2006 | Mahajani et al. | |
| 7,148,105 B2 | 12/2006 | Luoh | |
| 7,208,380 B2 | 4/2007 | Krishnan et al. | |
| 7,279,740 B2 * | 10/2007 | Bhattacharyya et al. | .... 257/324 |
| 7,332,768 B2 | 2/2008 | Govoreanu et al. | |
| 7,339,213 B2 | 3/2008 | Maeda et al. | |

(Continued)

OTHER PUBLICATIONS

Non-Final Office Action in U.S. Appl. No. 12/610,457, mailed Nov. 8, 2011, 14 pgs.

(Continued)

*Primary Examiner* — David Vu
(74) *Attorney, Agent, or Firm* — Servilla Whitney LLC

(57) ABSTRACT

A non-volatile memory semiconductor device comprising a semiconductor substrate having a channel and a gate stack above the channel. The gate stack comprises a tunnel layer adjacent to the channel, a charge trapping layer above the tunnel layer, a charge blocking layer above the charge trapping layer, a control gate above the charge blocking layer, and an intentionally incorporated interface region between the charge trapping layer and the charge blocking layer. The charge trapping layer comprises a compound including silicon and nitrogen, the charge blocking layer contains an oxide of a charge blocking component, and the interface region comprises a compound including silicon, nitrogen and the charge blocking component. The tunnel layer may comprise up to three tunnel sub-layers, the charge trapping layer may comprise two trapping sub-layers, and the charge blocking layer may comprise up to five blocking sub-layers. Various gate stack formation techniques can be employed.

11 Claims, 3 Drawing Sheets

(56) References Cited

U.S. PATENT DOCUMENTS

| | | | |
|---|---|---|---|
| 7,391,075 B2 | 6/2008 | Jeon et al. | |
| 7,419,909 B2 | 9/2008 | Kim et al. | |
| 7,436,018 B2* | 10/2008 | Bhattacharyya | 257/315 |
| 7,510,931 B2* | 3/2009 | Park et al. | 438/257 |
| 7,629,641 B2* | 12/2009 | Bhattacharyya | 257/324 |
| 7,736,975 B2* | 6/2010 | Choi et al. | 438/264 |
| 7,737,488 B2* | 6/2010 | Lai et al. | 257/325 |
| 7,749,848 B2 | 7/2010 | Bhattacharyya et al. | |
| 7,948,025 B2* | 5/2011 | Joo et al. | 257/324 |
| 7,968,406 B2* | 6/2011 | Ramaswamy et al. | 438/257 |
| 2005/0199944 A1* | 9/2005 | Chen | H01L 29/42332 257/324 |
| 2006/0102076 A1 | 5/2006 | Smith et al. | |
| 2007/0200168 A1 | 8/2007 | Ozawa et al. | |
| 2007/0221965 A1* | 9/2007 | Miller | H01L 21/2253 257/288 |
| 2007/0268746 A1 | 11/2007 | Choi et al. | |
| 2008/0073704 A1 | 3/2008 | Yasuda | |
| 2008/0217677 A1 | 9/2008 | Jeon et al. | |
| 2008/0290400 A1 | 11/2008 | Jenne et al. | |
| 2008/0293207 A1 | 11/2008 | Koutny et al. | |
| 2009/0039414 A1 | 2/2009 | Lue et al. | |
| 2009/0078990 A1 | 3/2009 | Yasuda | |
| 2010/0221905 A1* | 9/2010 | Hautala et al. | 438/591 |

OTHER PUBLICATIONS

Non-Final Office Action in U.S. Appl. No. 12/610,457, dated Mar. 22, 2012, 12 pgs.

IIT-Bombay, Applied Materials and SRC Collaborate to Advance Flash Memory Technology, http://www.reuters.com/articlePrint?articleId=US143742°/02B19-May-2008%BBW20080 May 19, 2008 , 2 pgs.

Sandhya, C. et al., "Nitride Engineering and the Effect of Interfaces on Charge Trap Flash Performance and Reliability", *IRPS 2008—IEEE International Reliability Physics Symposium* Apr. 27-May 1, 2008 , 6 pgs.

Sandhya, C. et al., "The Effect of Bank Gap Engineering of the Nitride Storage Node on Performance and Reliability of Charge Trap Flash", *IPFA 2008—15th International Symposium on the Physical and Failure Analysis of Integrated Circuits* Jul. 7-11, 2008, 6 pgs.

Non-Final Office Action in U.S. Appl. No. 12/610,457, mailed Mar. 4, 2011, 14 pgs.

Final Office Action in U.S. Appl. No. 12/610,457, mailed Jul. 10, 2012, 19 pgs.

Non-Final Office Action in U.S. Appl. No. 12/610,457, dated May 13, 2014, 11 pages.

Non-Final Office Action in U.S. Appl. No. 12/610,457, dated Dec. 31, 2014, 11 pages.

Final Office Action in U.S. Appl. No. 12/610,457, dated Sep. 4, 2014, 11 pages.

Final Office Action in U.S. Appl. No. 12/610,457, dated Apr. 29, 2015, 10 pages.

Non-Final Office Action in U.S. Appl. No. 12/610,457, dated Oct. 9, 2015, 15 pages.

Final Office Action in U.S. Appl. No. 12/610,457, mailed Feb. 26, 2016, 15 pgs.

\* cited by examiner

MULTI-LAYER CHARGE TRAP SILICON NITRIDE/OXYNITRIDE LAYER ENGINEERING WITH INTERFACE REGION CONTROL

CROSS-REFERENCE TO RELATED APPLICATIONS

This application is a divisional of U.S. patent application Ser. No. 12/610,457, filed on Nov. 2, 2009, the contents of which is specifically incorporated by reference herein in its entirety.

BACKGROUND OF THE INVENTION

Field of the Invention

Embodiments of the present invention generally relate to non-volatile memory devices, and more particularly to a charge trap flash memory device that yields minimum endurance degradation and a maximum program/erase window.

Description of the Related Art

Non-volatile memory (NVM) devices are electronic memory devices that retain their content when external power is removed. These devices are used in a wide variety of commercial and military electronic devices and equipment, such as hand-held telephones, radios and digital cameras. An NVM device comprises an insulating barrier, which can include multiple dielectric layers, located between a charge supply region and a charge storage region. The charge storage region can take the form of a floating gate structure or a charge trapping layer. Programming such NVM devices is accomplished by tunneling charge carriers of a first type such as electrons from the charge supply region, through the insulating barrier, toward the charge storage region.

One type of NVM device is flash memory. Flash memory devices can be further divided into floating gate flash memory and charge trap flash (CTF) memory. In floating gate memory devices, a floating gate of a metal layer or a metal-like layer is used as the charge storage layer. In CTF memory devices, such as in semiconductor-oxide-nitride-oxide-semiconductor (SONOS) memory devices, a charge trapping dielectric layer is used.

Essentially, a SONOS memory cell is a conventional n-channel metal-oxide-semiconductor transistor (NMOS) with a gate dielectric of a thermal oxide layer of about 2-7 nm thickness, a silicon nitride layer of about 3-12 nm thickness and a second oxide layer with a thickness of between 5 nm and 20 nm. The thin oxide layer is an exemplary tunneling layer and the nitride layer is an exemplary charge trapping layer. At a positive gate bias, electrons can tunnel from the substrate through the ultra thin oxide layer to the nitride layer, where they are subsequently trapped. Silicon nitride, for example, has an intrinsic property of trapping charge (electrons or holes).

In SONOS memory devices, the trapped charges create a threshold voltage shift of the transistor. The threshold voltage $V_{th}$ varies depending on whether the NVM device is in the program state, wherein charges (electrons) are injected into the charge trapping layer, or in the erase state, wherein electrons leave (or holes enter) the charge trapping layer. This state in turn varies the gate voltage level needed to allow a certain current level to conduct through the channel. Hence, operation of charge trapping NVM semiconductor devices is based on the threshold voltage Vth being varied by charges trapped or stored in a charge trapping layer.

NVM devices that use charge trapping as a charge storage mechanism instead of a floating gate are becoming more and more prevalent. Such devices store charge in a charge trapping layer, such as a silicon nitride layer sandwiched between two oxide layers or, as an alternative, in nanocrystals. Charge trapping NVM devices are becoming more prevalent partially because they are believed to have considerable potential for use in future complementary metal-oxide-semiconductor generations, particularly for technologies with dimensions of 90 nm and smaller. One difference between charge trapping devices and floating gate devices is that with charge trapping devices electrons are trapped in energy minima caused by imperfections in the charge trapping layer or, in the case of nanocrystal memories, on nanocrystals embedded in a gate oxide. These energy minima act as localized charge storage sites that are isolated from each other in which charge is trapped and stored. In the case of electrons, for example, the free electron energy levels associated with such imperfections and/or nanocrystals are below the free electron energy levels of the surrounding material, thereby creating energy wells and trapping free electrons therein at the locations of the imperfections and/or nanocrystals.

As mentioned, one reason for the growing interest in charge trapping devices is that such devices are relatively easy to scale with associated reductions in physical geometries for future semiconductor processing technology generations. For instance, the use of charge trapping devices eliminates floating gate patterning issues, such as those related to lithography, overlay and topography. Moreover, charge trapping devices may be programmed and erased using lower voltages than floating gate devices implemented in the same semiconductor process. The ability to use lower voltages is important, especially in embedded memories, since the market continues to demand devices that use lower operating voltages and have reduced power consumption. Another requirement is endurance which needs to meet different specifications for different application. A stringent endurance requirement is needed for solid state drives which is a growth sector for NAND Flash, (see JEDEC specifications for NAND performance).

However, prior art charge trapping NVM devices have certain disadvantages. One such drawback relates to the relatively poor erasing efficiency characteristic of these memory devices that prevents them from meeting backwards compatibility requirements of a $\sim 10^{-4}$ second erasing time at a negative (around $-3$ V) threshold voltage $V_{th}$. The known charge trap flash memory devices have this problem because of electron back tunneling through the blocking layer. Such back tunneling causes the erase threshold voltage $V_{th}$ to not drop off sufficiently or sufficiently quickly in known SONOS devices. For example, the erase threshold voltage $V_{th}$ in known devices should typically drop from about 1 V to about $-3$ V during the desired erase time of about $10^{-3}$ seconds. The erase threshold voltage $V_{th}$ may then continue to decrease or may increase, especially when the gate bias is about $-17$ V to $-15$ V.

Another disadvantage is the limited data retention capability of known charge trapping devices. Data retention is the ability of an NVM device to retain data programmed into individual memory cells. This limited data retention capability is due, in part, to the use of thin dielectrics between the substrate (e.g., the charge supply region) and the charge trapping layer. While the use of a thicker conventional tunnel dielectric such as $SiO_2$ would improve this data retention capability, this improvement would come at the expense of worsened erase saturation for the devices and, consequently, the duration of a program/erase window (increased duration) for current charge trapping NVM devices. Erase saturation is the inability to completely remove or compensate for the charge stored in the charge storage region of a charge trapping NVM device after programming the device. Therefore, alternative approaches for implementing charge trapping NVM devices are desirable.

Retention and memory window (before and after cycling or endurance) are two challenges associated with CTF performance. Silicon nitride trap layer engineering by changing the composition (for example Si:N ratio) provides an important trade-off. As the atomic percent N in $SiN_x$:H (hydrogen is frequently incorporated from precursors in the range of about 0 to about 15 atomic percent) is increased two trends are observed, the memory window decreases and the retention is strongly enhanced. In addition it has been observed that the memory window degradation after endurance increases (worsens) with the increase in the nitrogen content.

The profitability of CTF technology is driven by multi-level cell (MLC) operation which requires a large memory window. On the other hand, retention is a core specification. Due to conflicting trends, a trade-off is present. Nitrogen-rich nitride can produce satisfactory retention but enhanced endurance memory window degradation. An ideal solution would provide satisfactory retention and improve endurance degradation for maximum memory window for reliable MLC operation.

Thus, there is a need for an optimal NVM semiconductor device that simultaneously provides minimum endurance degradation and a maximum program/erase window, and a corresponding manufacturing method.

SUMMARY OF THE INVENTION

One or more embodiments of the invention are directed to non-volatile memory semiconductor devices comprising a semiconductor substrate having a channel and a gate stack above the channel. The gate stack comprises a tunnel layer adjacent to the channel, a charge trapping layer above the tunnel layer comprising a compound including silicon and nitrogen, a charge blocking layer above the charge trapping layer containing an oxide of a charge blocking component, a control gate above the charge blocking layer, and an interface region between the charge trapping layer and the charge blocking layer. The interface region is intentionally incorporated into the gate stack and comprises a compound including silicon, nitrogen and the charge blocking component.

In detailed embodiments, the semiconductor substrate comprises silicon. In more detailed embodiments, the tunnel layer comprises at least one compound selected from $SiO_2$, $Al_2O_3$, MgO, SrO, BaO, TiO, $Ta_2O_5$, $BaTiO_3$, $BaZrO_3$, $ZrO_2$, $HfO_2$, $Y_2O_3$, $ZrSiO_4$, $HfSiO_4$ and $LaAlO_3$. In further detailed embodiments, the tunnel layer comprises at least one silicon nitride compound having a chemical formula of $Si_xN_y$. Hydrogen is another element found in deposited SiN which affects traps and trap generation. Hydrogen is incorporated into the silicon nitride from the chemical precursors used and is not unexpected. The hydrogen is frequently present in the range of about 0 to about 15 atomic percent. $Si_xN_yH_z$ is another possibility where H may be 0-20 atomic percentage of the composition. In specific embodiments, the tunnel layer comprises SiON.

In some detailed embodiments, the tunnel layer comprises a first tunnel sub-layer, a second tunnel sub-layer and a third tunnel sub-layer. The first tunnel sub-layer comprises at least one compound selected from the group consisting of $SiO_2$ and SiON. The second tunnel sub-layer comprises at least one compound selected from the group consisting of $Al_2O_3$, MgO, SrO, BaO, TiO, $Ta_2O_5$, $BaTiO_3$, $BaZrO_3$, $ZrO_2$, $HfO_2$, $Y_2O_3$, $ZrSiO_4$, $HfSiO_4$, $LaAlO_3$ and $Si_xN_y$. The third tunnel sub-layer comprises at least one compound selected from the group consisting of $SiO_2$ and SiON. According to specific embodiments, the tunnel layer has a thickness in the range of about 5 nm to 12 nm.

The charge trapping layer of some embodiments comprises a first trapping sub-layer and a second trapping sub-layer. The first trapping sub-layer is adjacent to the tunnel layer and has a first composition engineered to provide a low charge trap density to increase retention of information. The second trapping sub-layer has a second composition adjacent to the interface region.

In detailed embodiments, the first trapping sub-layer comprises stoichiometric silicon nitride. In specific embodiments, the first trapping sub-layer comprises a nitrogen-rich silicon nitride compound containing about the same as or more nitrogen on an atomic percentage basis than is present in stoichiometric silicon nitride. In some detailed embodiments, the first trapping sub-layer comprises a composition of at least one silicon nitride compound having a chemical formula of $Si_xN_y$ present in the range of about 50% to 100% on a atomic percentage basis, and oxygen present in the range of about 0% to 50% on a atomic percentage basis.

In detailed embodiments, the second trapping sub-layer is engineered to provide a low charge trap generation and minimize endurance degradation of the device. In some embodiments, the second trapping sub-layer has a high charge trap density for improved memory window. In specific embodiments, the second trapping sub-layer comprises a silicon-rich silicon nitride compound containing more silicon on a atomic percentage basis than is present in stoichiometric silicon nitride.

In one or more embodiments, the charge trapping layer is a graded layer having a variable composition and a thickness in the range of about 1 nm to 20 nm. The charge trapping layer comprises nitrogen-rich $Si_xN_y$ adjacent to the tunnel layer and silicon-rich $Si_xN_y$ adjacent to the interface region.

In some embodiments, the interface region comprises SiON and has a thickness in the range of about 1 nm to 5 nm.

In detailed embodiments, the charge blocking layer comprises a first blocking sub-layer, a second blocking sub-layer and a third blocking sub-layer. The first blocking sub-layer comprises at least one compound selected from the group consisting of $SiO_2$ and SiON. The second blocking sub-layer comprises at least one compound selected from the group consisting of $Al_2O_3$, MgO, SrO, BaO, TiO, $Ta_2O_5$, $BaTiO_3$, $BaZrO_3$, $ZrO_2$, $Y_2O_3$, $ZrSiO_4$, $HfSiO_4$, $LaAlO_3$ and $Si_xN_y$. The third blocking sub-layer comprises at least one compound selected from the group consisting of $SiO_2$ and SiON.

In specific embodiments, the charge blocking layer further comprises at least a fourth blocking sub-layer and a fifth blocking sub-layer. The fourth blocking sub-layer adjacent to the interface region, the fourth blocking sub-layer comprises at least one silicon nitride compound having a chemical formula of $Si_xN_y$. The fifth blocking sub-layer is adjacent to the control gate and comprises at least one silicon nitride compound having a chemical formula of $Si_xN_y$.

In detailed embodiments, the charge blocking layer has a thickness in the range of about 10 nm to 15 nm.

Additional embodiments of the invention are directed to methods of forming a gate stack on a semiconductor substrate having a channel. A tunnel layer is deposited over the channel. A charge trapping layer comprising a compound including silicon and nitrogen is deposited on top of the tunnel layer. A charge blocking layer containing an oxide of a charge blocking component is deposited on top of an interface region. An interface region is formed between the charge trapping layer and the charge blocking layer. The interface region comprises a compound including silicon, nitrogen and the charge blocking component. A control gate is placed on top of the charge blocking layer.

In detailed embodiments, depositing a tunnel layer over the channel comprises depositing a first tunnel sub-layer, a second tunnel sub-layer and a third tunnel sub-layer. The first tunnel sub-layer is deposited over the channel. The first tunnel sub-layer comprises at least one component selected from the group consisting of $SiO_2$ and SiON. The second tunnel sub-layer is deposited on top of the first tunnel sub-layer. The second tunnel sub-layer comprises at least one component selected from the group consisting of $Al_2O_3$, MgO, SrO, BaO, TiO, $Ta_2O_5$, $BaTiO_3$, $BaZrO_3$, $ZrO_2$, $HfO_2$, $Y_2O_3$, $ZrSiO_4$, $HfSiO_4$, $LaAlO_3$ and $Si_xN_y$. A third tunnel sub-layer is deposited on top of the second tunnel sub-layer. The third tunnel sub-layer comprises at least one component selected from the group consisting of $SiO_2$ and SiON.

In some detailed embodiments, depositing a charge trapping layer comprises depositing a first trapping sub-layer and a second trapping sub-layer. The first trapping sub-layer is deposited in a first chamber without air exposure. The first trapping sub-layer being adjacent to the tunnel layer. The second trapping sub-layer is deposited in the first chamber without air exposure. The second trapping sub-layer being adjacent to the interface region.

In specific embodiments, forming the interface region comprises one or more of controlled oxidation of the second trapping sub-layer, oxidizing the second trapping sub-layer by exposing the second trapping sub-layer to air, and depositing a discrete interface region on top of the charge trapping layer in the first chamber without air exposure.

In further specific embodiments, controlled oxidation of the second trapping sub-layer comprises one or more of oxidizing the second trapping sub-layer using wet oxidation, oxidizing the second trapping sub-layer using dry oxidation, oxidizing the second trapping sub-layer using radical oxidation, oxidizing the second trapping sub-layer using plasma oxidation, and oxidizing the second trapping sub-layer using oxygen implantation.

In other specific embodiments, the first trapping sub-layer, the second trapping sub-layer and the interface region are deposited in separate chambers without air exposure between depositions.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
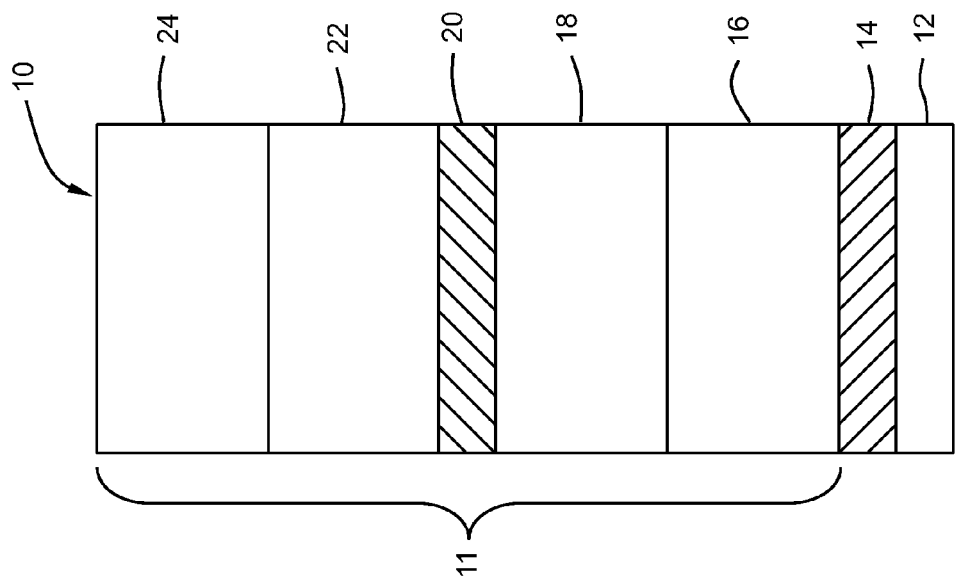
FIG. 1 illustrates an enlarged front elevation view of one embodiment of the non-volatile memory semiconductor device according to the present invention.

An embodiment of the non-volatile memory semiconductor device 10 is depicted in FIG. 1. The device 10 includes a semiconductor substrate 12 having a channel 14 and a gate stack 11 above the channel 14. As is known in the art, the substrate 12 may comprise silicon. The gate stack 11 comprises a tunnel layer 16 adjacent to the channel 14, a charge trapping layer 18 above the tunnel layer 16, a charge blocking layer 22 above the charge trapping layer 18, a control gate 24 above the charge blocking layer 22, and an interface region 20 between the charge trapping layer 18 and the charge blocking layer 22.

The charge trapping layer 18 comprises a compound containing silicon and nitrogen, while the charge blocking layer 22 contains an oxide of a charge blocking component. The interface region 20 comprises a compound containing silicon, nitrogen and a charge blocking component. Since the interface region 20 is intentionally incorporated into the gate stack 11, it can be engineered for a desired rate of formation, thickness and composition, for example. Thus, the interface region 20 is generally distinct from, and preferable to, any products resulting from a spontaneous oxidation reaction of the charge trapping layer 18 and atmospheric air.

While dimensions of the tunnel layer 16 can vary, the thickness is generally in the range of about 5 nm to 12 nm. Examples of suitable compositions of the tunnel layer 16 include, but are not limited to, silicon oxides, silicon nitrides, silicon oxynitrides, materials having large dielectric constants, and combinations thereof. In detailed embodiments the tunnel layer 16 comprises one or more compounds having chemical formulae of $SiO_2$, $Si_xN_y$, SiON, $Al_2O_3$, MgO, SrO, BaO, TiO, $Ta_2O_5$, $BaTiO_3$, $BaZrO_3$, $ZrO_2$, $HfO_2$, $Y_2O_3$, $ZrSiO_4$, $HfSiO_4$ and $LaAlO_3$ may be utilized in the tunnel layer 16.

Figure 2:
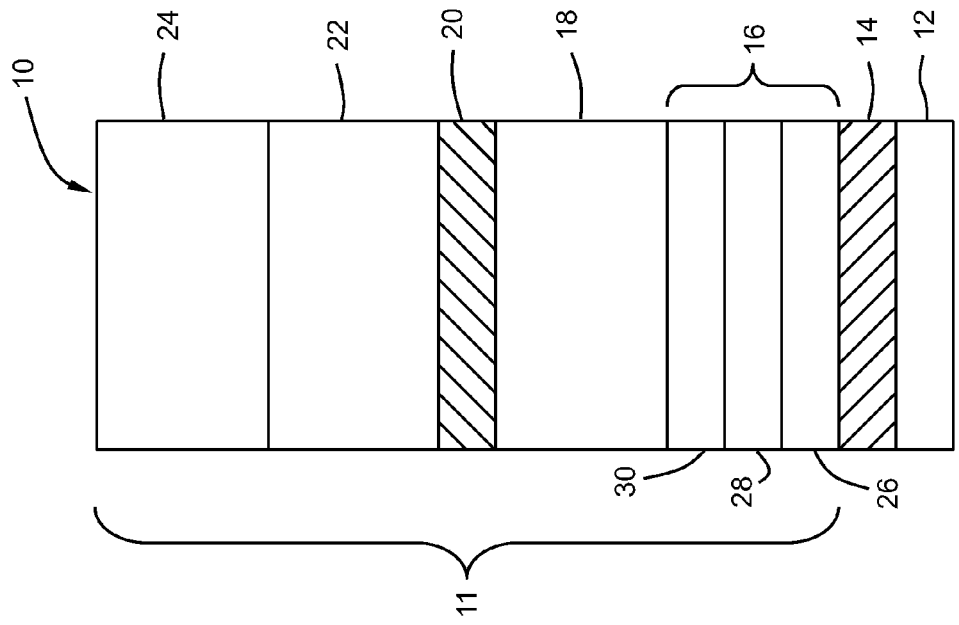
FIG. 2 illustrates an enlarged front elevation view of another embodiment of the non-volatile memory semiconductor device according to the present invention.

In certain embodiments of the device 10, as illustrated in FIG. 2, the tunnel layer 16 may comprise a first tunnel sub-layer 26, a second tunnel sub-layer 28 and a third tunnel sub-layer 30. In specific embodiments, the first tunnel sub-layer 26 and the third tunnel sub-layer 30 each comprise $SiO_2$, SiON or both. In detailed embodiments, the second tunnel sub-layer 28 comprises at least one compound selected from the group consisting of $Al_2O_3$, MgO, SrO, BaO, TiO, $Ta_2O_5$, $BaTiO_3$, $BaZrO_3$, $ZrO_2$, $HfO_2$, $Y_2O_3$, $ZrSiO_4$, $HfSiO_4$, $LaAlO_3$ and $Si_xN_y$. Other materials that have large dielectric constants may also be incorporated into the second tunnel sub-layer 28.

The second tunnel sub-layer 26 may be optimized for retention, implying smaller trap density and deeper traps. In various embodiments, the second tunnel sub-layer 26 is a stoichiometric SiN deposited by chemical vapor deposition (CVD), a nitrogen-rich SiN deposited by CVD, a SiN with 0-50% oxygen uniformly deposited by CVD or a SiN with 0-50% oxygen implanted by DPO or P3i. The thickness of the second tunnel sub-layer 26 in some embodiments is in the range of about 1 to about 10 nm.

In specific embodiments, the combination of the charge trapping layer 18 and the interface region 20 may be optimized for low trap generation during endurance and the SiN layer may be optimized with high trap density for memory window improvement. Controlling the composition of the layers and thicknesses may impact the performance of resulting devices.

Figure 3:
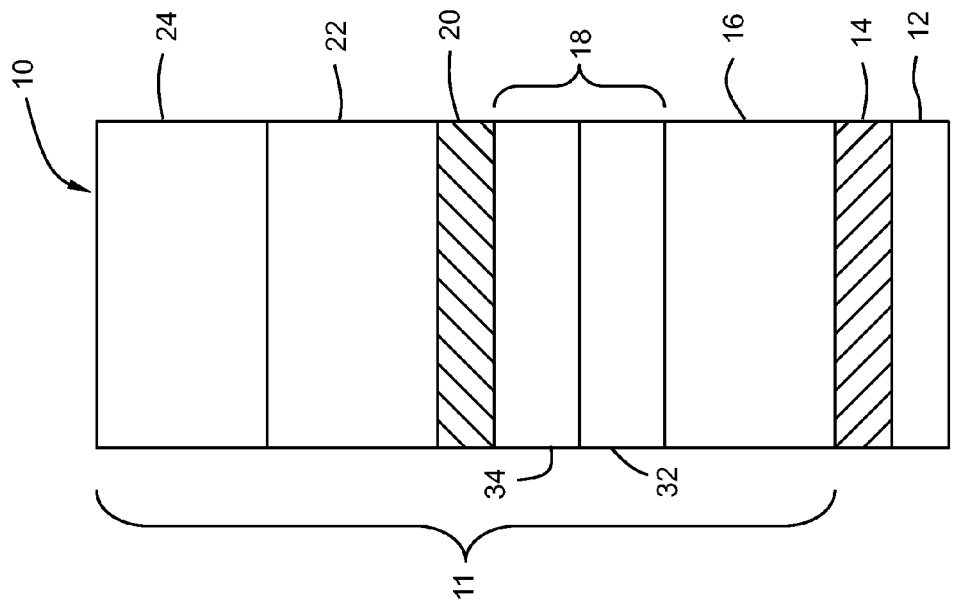
FIG. 3 illustrates an enlarged front elevation view of an additional embodiment of the non-volatile memory semiconductor device according to the present invention.

In order to optimize the device 10, the charge trapping layer 18 may be divided into regions that each provide increased retention of information, decreased endurance degradation or expanded memory window. FIG. 3 shows such an embodiment. The charge trapping layer 18 comprises a first trapping sub-layer 32 adjacent to the tunnel layer 16 and a second trapping sub-layer 34 adjacent to the interface region 20. The first trapping sub-layer 32 has a first composition engineered to provide a low charge trap density for increasing retention of information. On the other hand, the second trapping sub-layer 34 can be designed in one of two ways: with a low charge trap generation for decreased endurance degradation or with a high charge trap density for improved memory window. In certain aspects of the invention, the first trapping sub-layer 32 comprises stoichiometric silicon nitride or a nitrogen-rich silicon nitride compound containing more nitrogen on an atomic percentage basis than is present in stoichiometric silicon nitride.

According to detailed embodiments of the device 10, the first trapping sub-layer 32 comprises a composition of at least one silicon nitride compound having a chemical formula of $Si_xN_y$ present in the range of about 50% to 100% on an atomic percentage basis and oxygen present in the range of about 0% to 50% on the same basis. The second trapping sub-layer 34 may comprise a silicon-rich silicon nitride compound containing more silicon on an atomic percentage basis than is present in stoichiometric silicon nitride.

Alternatively, as represented in FIG. 2, the charge trapping layer 18 may be a single graded layer that has a variable composition. The charge trapping layer 18 generally comprises nitrogen-rich $Si_xN_y$ adjacent to the tunnel layer 16 and silicon-rich $Si_xN_y$ adjacent to the interface region 20. The thickness of the charge trapping layer 18 may be in the range of about 1 nm to about 20 nm. For the following reasons, this embodiment is believed to be more useful than depicted in FIG. 3. When the composition of the charge trapping layer is changed, a sharp offset in conduction band and valence band results. This discontinuity in conduction band or valence band incites high-energy electron scattering at the interface between the first trapping sub-layer 32 and the second trapping sub-layer 34 during the repeated program/erase operation or program/erase cycling or endurance. The electronic energy is transferred to the dielectric network at the interface, which may generate defects such as broken bonds during operation. Undesirable modifications of the device 10 and its performance throughout its lifetime of program/erase cycling or endurance result. By utilizing the graded charge trapping layer 18, the abruptness of the interface is reduced, the scattering is reduced or even avoided, and performance of the device 10 is improved. With this configuration, scattering is postponed and occurs when electrons reach the interface between the interface region 20 and the charge blocking layer 22, which is specially engineered for low defect generation under such conditions. Preferably, the interface region 20 comprises SiON and has a thickness in the range of about 1 nm to 5 nm.

Figure 4:
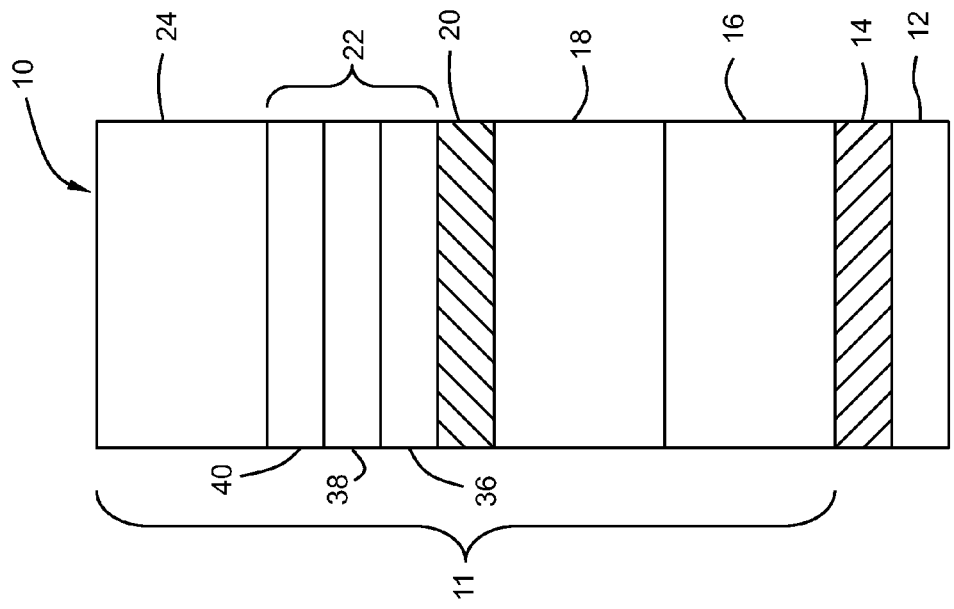
FIG. 4 illustrates an enlarged front elevation view of an additional embodiment of the non-volatile memory semiconductor device according to the present invention.

As discussed previously with respect to FIG. 1, the charge blocking layer 22 may comprise a single layer. In other embodiments of the invention, as shown in FIG. 4, the charge blocking layer 22 may comprise a first blocking sub-layer 36, a second blocking sub-layer 38 and a third blocking sub-layer 40. In detailed embodiments, the first blocking sub-layer 36 and the third blocking sub-layer 40 may each comprise $SiO_2$, SiON or both. The second blocking sub-layer 38 may comprise at least one compound selected from the group consisting of $Al_2O_3$, MgO, SrO, BaO, TiO, $Ta_2O_5$, $BaTiO_3$, $BaZrO_3$, $ZrO_2$, $HfO_2$, $Y_2O_3$, $ZrSiO_4$, $HfSiO_4$, $LaAlO_3$ and $Si_xN_y$. Other materials that have large dielectric constants may also be incorporated into the second blocking sub-layer 38.

Figure 5:
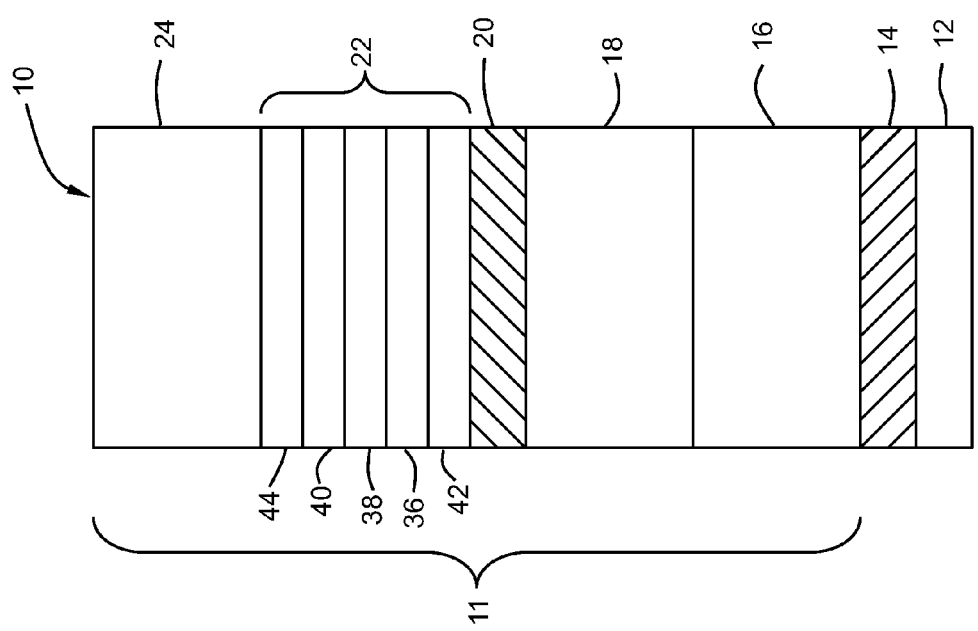
FIG. 5 illustrates an enlarged front elevation view of an additional embodiment of the non-volatile memory semiconductor device according to the present invention.

Alternatively, as illustrated in FIG. 5, the charge blocking layer 22 may comprise a first blocking sub-layer 36, a second blocking sub-layer 38, a third blocking sub-layer 40, a fourth blocking sub-layer 42 and a fifth blocking sub-layer 44. The fourth blocking sub-layer 42 is adjacent to the interface region 20 while the fifth blocking sub-layer 44 is adjacent to the control gate 24. Preferably, the fourth blocking sub-layer 42 and the fifth blocking sub-layer 44 each comprises at least one silicon nitride compound having a chemical formula of $Si_xN_y$. The charge blocking layer 22 has a total thickness in the range of about 10 nm to 15 nm. In specific embodiments incorporating multilayered blocking oxide layers, each layer can have a thickness in the range of about 1 nm to about 5 nm.

Methods used to form the gate stack on the substrate 12 will now be described. The tunnel layer 16 is deposited on the substrate 12 above the channel 14. The charge trapping layer 18 is deposited on top of the tunnel layer 16. In addition, the interface region 20 is formed on top of the charge trapping layer 18. The charge blocking layer 22 is deposited on top of the interface region 20. A control gate is placed on top of the charge blocking layer 22. For embodiments in which the tunnel layer comprises multiple tunnel sub-layers, the first tunnel sub-layer 26 is deposited over the channel 14 first. Then, the second tunnel sub-layer 28 is deposited on top of the first tunnel sub-layer 26. The third tunnel sub-layer 30 is deposited on top of the second tunnel sub-layer 28. For embodiments in which the charge trapping layer 18 comprises multiple trapping sub-layers, the first trapping sub-layer 32 is deposited on the tunnel layer 16 in a first chamber without air exposure. Subsequently, the second trapping sub-layer 34 is deposited on top of the first trapping sub-layer 32.

Importantly, formation of the interface region 20 can be accomplished in several ways. The second trapping sub-layer 34 can be oxidized in a controlled chemical reaction. Various techniques can be employed in this regard, including wet oxidation, dry oxidation, radical oxidation, plasma oxidation and oxygen implantation. Other suitable controlled processes known in the art can be used as well. Alternatively, the second trapping sub-layer 34 can be oxidized by exposing it to air. The interface region 20 can also be deposited on top of the charge trapping layer 18 in the first chamber without air exposure. Preferably, the second trapping sub-layer 34 and the interface region 20 are deposited in separate chambers without air exposure between depositions. The oxidation may function as a method to add oxygen or additionally to partially remove or modulate nitrogen and hydrogen. In detailed embodiments, the interface region 20 is formed by one or more of controlled oxidation of the second trapping sub-layer 34, oxidizing the second trapping sub-layer 34 by exposing the second trapping sub-layer 34 to air and depositing a discrete interface region 20 on top of the charge trapping layer 18 in the first chamber without air exposure.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method of forming a gate stack on a semiconductor substrate having a channel, the method comprising:
    depositing a tunnel layer over the channel, wherein the tunnel layer comprises at least one silicon nitride compound having a chemical formula of $Si_xN_yH_z$;
    depositing a charge trapping layer comprising a compound including silicon and nitrogen on top of the tunnel layer, the charge trapping layer comprising at least a first trapping sub-layer and a second trapping sub-layer, the first trapping sub-layer adjacent to the tunnel layer, the first trapping sub-layer having a first composition engineered to provide a low charge trap density to increase retention of information, the first composition comprising a nitrogen-rich silicon nitride compound and oxygen, the first composition having about the same as or more nitrogen on an atomic percentage basis than is present in stoichiometric silicon nitride, the silicon nitride compound present in the range of about 50% to less than 100% on an atomic percentage basis and oxygen present in the range of greater than 0% to about 50% on an atomic percentage basis, the second trapping sub-layer comprising a silicon-rich silicon nitride compound containing more silicon on an atomic percentage basis than is present in stoichiometric silicon nitride;
    forming an interface region on the charge trapping layer, the interface region comprising a discrete layer with a compound including silicon, nitrogen and a charge blocking component selected from the group consisting of Al, Mg, Sr, Ba, Ti, Ta, Zr, Hf, Y, La and combinations thereof;
    depositing a charge blocking layer on top of the interface region, the charge blocking layer containing an oxide of the charge blocking component included in the interface region; and
    placing a control gate on top of the charge blocking layer.

2. The method of forming a gate stack of claim 1, wherein depositing a tunnel layer over the channel comprises:
    depositing a first tunnel sub-layer over the channel, the first tunnel sub-layer further comprising at least one component selected from the group consisting of $SiO_2$ and SiON;
    depositing a second tunnel sub-layer on top of the first tunnel sub-layer, the second tunnel sub-layer comprising at least one component selected from the group consisting of $Al_2O_3$, MgO, SrO, BaO, TiO, $Ta_2O_5$, $BaTiO_3$, $BaZrO_3$, $ZrO_2$, $HfO_2$, $Y_2O_3$, $ZrSiO_4$, $HfSiO_4$, $LaAlO_3$ and $Si_xN_y$; and
    depositing a third tunnel sub-layer on top of the second tunnel sub-layer, the third tunnel sub-layer comprising at least one component selected from the group consisting of $SiO_2$ and SiON.

3. The method of forming a gate stack of claim 1, wherein the first trapping sub-layer in deposited in a first chamber without air exposure; and
    the second trapping sub-layer is deposited in the first chamber without air exposure.

4. The method of forming a gate stack of claim 3, wherein forming the interface region comprises one or more of controlled oxidation of the second trapping sub-layer, oxidizing the second trapping sub-layer by exposing the second trapping sub-layer to air, and depositing a discrete interface region on top of the charge trapping layer in the first chamber without air exposure.

5. The method of claim 4, wherein controlled oxidation of the second trapping sub-layer comprises one or more of oxidizing the second trapping sub-layer using wet oxidation, oxidizing the second trapping sub-layer using dry oxidation, oxidizing the second trapping sub-layer using radical oxidation, oxidizing the second trapping sub-layer using plasma oxidation, and oxidizing the second trapping sub-layer using oxygen implantation.

6. The method of forming a gate stack of claim 4, wherein the first trapping sub-layer, the second trapping sub-layer and the interface region are deposited in separate chambers without air exposure between depositions.

7. The method of forming a gate stack of claim 1, wherein the step of depositing a tunnel layer over the channel further comprises a tunnel layer having at least one compound selected from $SiO_2$, $Al_2O_3$, MgO, SrO, BaO, TiO, $Ta_2O_5$, $BaTiO_3$, $BaZrO_3$, $ZrO_2$, $HfO_2$, $Y_2O_3$, $ZrSiO_4$, $HfSiO_4$ and $LaAlO_3$.

8. The method of forming a gate stack of claim 1, wherein the step of depositing a tunnel layer over the channel further comprises a tunnel layer having SiON.

9. The method of forming a gate stack of claim 1, wherein the step of depositing a tunnel layer over the channel comprises a tunnel layer having a thickness in the range of about 5 nm to 12 nm.

10. The method of forming a gate stack of claim 1, wherein the step of forming the interface region between the charge trapping layer and the charge blocking layer comprises an interface region having a thickness in the range of about 1 nm to 5 nm.

11. The method of forming a gate stack of claim 1, wherein the step of depositing a charge blocking layer comprises a charge blocking layer having a thickness in the range of about 10 nm to 15 nm.

* * * * *